United States Patent [19]

Rischmueller

[11] Patent Number: 4,688,157
[45] Date of Patent: Aug. 18, 1987

[54] SWITCHING CIRCUIT USING A FAST DIODE AND PROVIDED WITH MEANS FOR DAMPING OSCILLATIONS ON OPENING

[75] Inventor: Klaus Rischmueller, Aix en Provence, France

[73] Assignee: Thomson-CSF, Paris, France

[21] Appl. No.: 816,716

[22] Filed: Jan. 7, 1986

[30] Foreign Application Priority Data

Jan. 15, 1985 [FR] France ................. 85 00522

[51] Int. Cl.$^4$ ........................................ H02M 3/335
[52] U.S. Cl. .................. 363/20; 307/317 R; 323/351; 363/53; 363/126; 363/147
[58] Field of Search ............ 363/20, 44, 126, 53, 363/69, 147; 307/317 R, 319; 357/20; 323/351

[56] References Cited

U.S. PATENT DOCUMENTS

| 2,895,100 | 7/1959 | Filberich et al. | 363/126 |
| 3,418,587 | 12/1968 | Riebman et al. | 307/317 |
| 4,356,541 | 10/1982 | Ikenoue et al. | 363/126 |

FOREIGN PATENT DOCUMENTS

| 734084 | 5/1966 | Canada | 363/126 |
| 2915837 | 10/1980 | Fed. Rep. of Germany | 363/126 |
| 2405576 | 5/1979 | France | |

OTHER PUBLICATIONS

Cielo et al., "High Voltage-Fast Recovery Diode Module," IBM Tech. Discl. Bul., vol. 16, No. 7, p. 2068, Dec. 1973.

Primary Examiner—William H. Beha, Jr.
Attorney, Agent, or Firm—Roland Plottel

[57] ABSTRACT

The invention relates to switching circuits using fast rectifier diodes. To damp the oscillations liable to occur at the time when the fast diode passes from a conducting state into a blocked state, a supplementary diode with a lower blocking speed and a smaller current passage cross-section than the fast diode is positioned in parallel on the latter and with the same polarity. Application to cut off power supplies, undulators, converters, etc.

3 Claims, 9 Drawing Figures

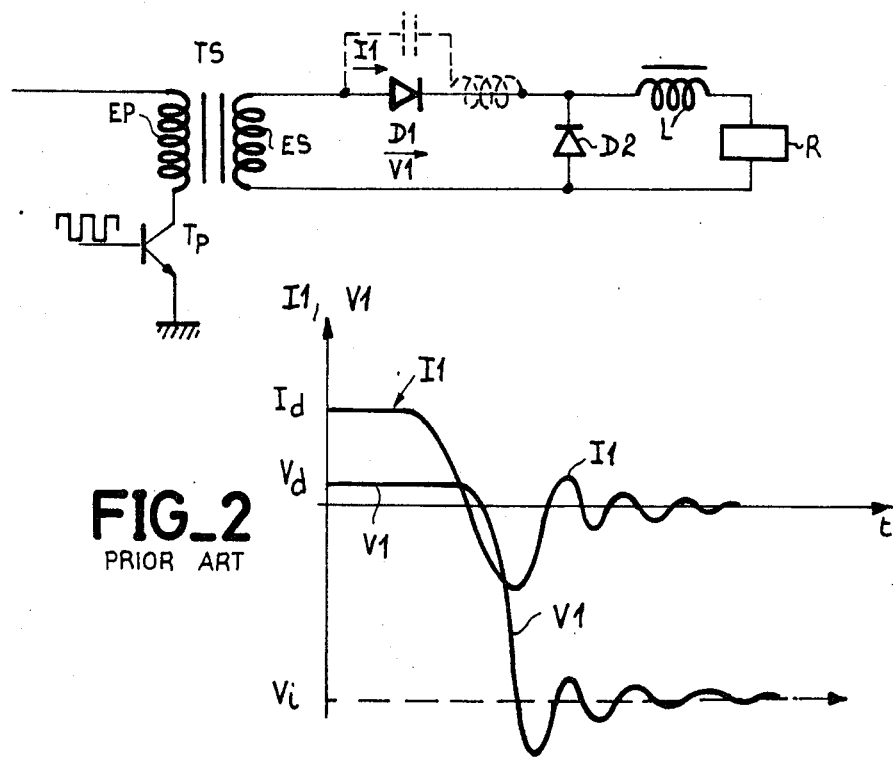
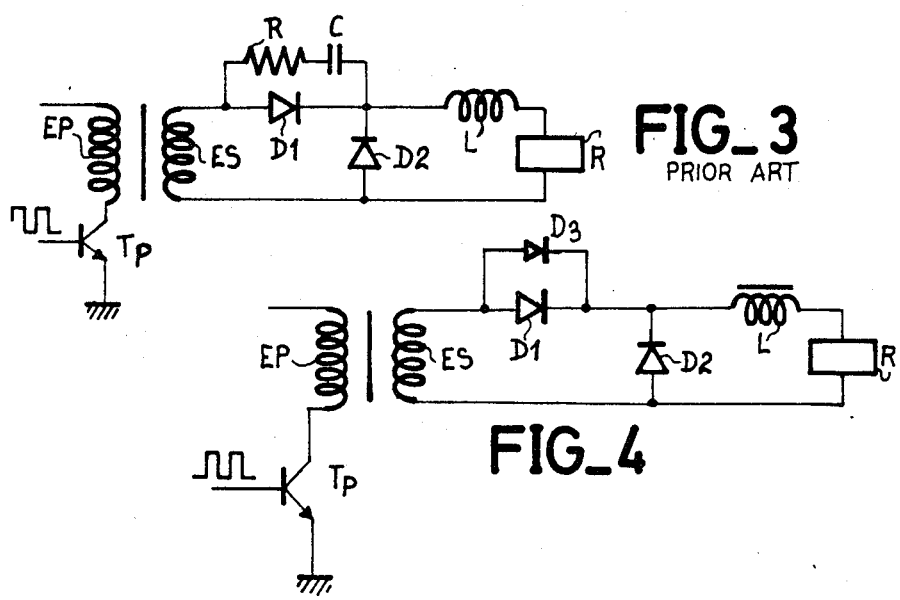

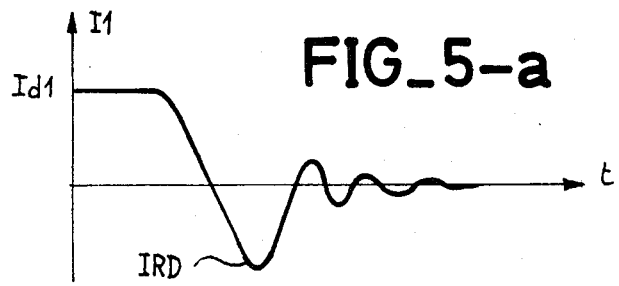
FIG_5-a
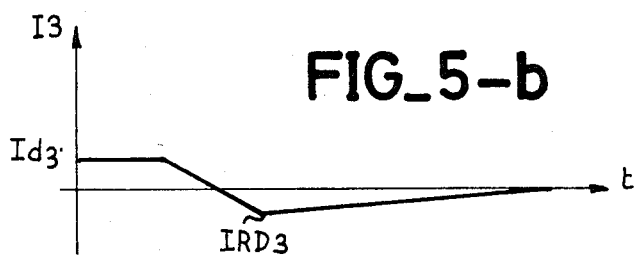
FIG_5-b
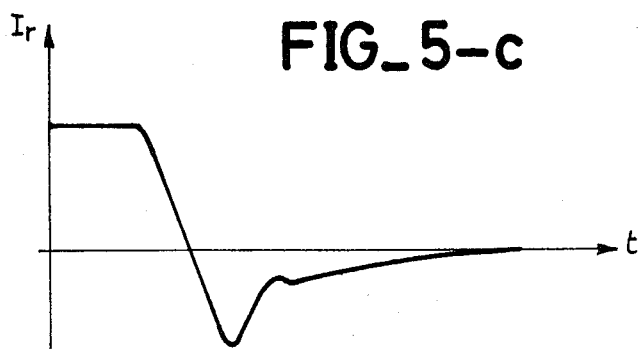
FIG_5-c
FIG_6
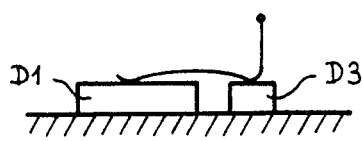
FIG_7
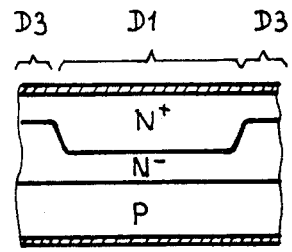

SWITCHING CIRCUIT USING A FAST DIODE AND PROVIDED WITH MEANS FOR DAMPING OSCILLATIONS ON OPENING

BACKGROUND OF THE INVENTION

The present invention relates to switching circuits, such as converters, switching supplies, choppers, undulators, etc. These circuits often comprise rectifier diodes in series with inductive loads and it is necessary to use fast diodes, i.e. diodes which block rapidly during the inversion of the voltage at their terminals.

However, in view of the stray or parasitic inductances and capacitances of the circuit in which these diodes are located, at the time of blocking, current and voltage oscillations often occur. These oscillations lead to disturbances in the circuit, such as, e.g. an abnormal reswitching of the transistors in conduction or interfering signals prejudicing the control logic of the circuit. They also cause interference on the output voltage of the circuits (supply systems, undulators, etc.) and radio interference.

FIG. 1 shows a typical prior art rectifier circuit positioned at the terminals of the secondary winding ES of the output transformer TS of a switching-mode supply (primary winding EP being in series with a switch $T_p$ operated at the switching frequency). This circuit comprises a fast rectifier diode D1 in series between the secondary winding ES and the inductive load L,R and another diode D2 in parallel with the load only. In FIG. 1, a stray inductance (cabling inductance) and stray capacitance (of diode D1) are shown in dotted line form.

FIG. 2 shows the waveshapes of current I1 in the rectifier diode D1 and the voltage V1 at its terminals at the time of switching, i.e., at the time of the transition from a high direct current Id to a zero current and a low direct voltage Vd to a high negative reverse voltage Vi. This transition has high amplitude oscillations, which need to be heavily damped without leading to excessive losses and without using a large number of components.

What generally has been done up to now for damping is to connect a series network RC in parallel with diode D1, as represented in FIG. 3. However, this leads to a number of disadvantages. The cabling parasitic inductance of the circuit produces a series RLC network, which normally is insufficiently damped, particularly for high frequency oscillations, because it is impractical to increase the value of capacitor C (for increasing damping) without leading to significant losses, (because capacitor C is charged and discharged across resistor R during each half-cycle). Moreover, an increase in the capacitance C, apart from the significant losses produced, reduces the rectifying effect. The added components, i.e., the resistor and capacitor, are relatively large and require a certain connection conductor length, which makes it impossible to reduce the cabling inductance. Finally, the resistor and capacitor cannot readily be integrated onto a semiconductor chip with diodes D1 and D2.

SUMMARY OF THE INVENTION

In order to solve these various problems, the present invention proposes inclusion parallel with the fast rectifier diode, a slow diode, which has a much smaller junction area than that of the fast diode and takes a much longer time to switch the blocked state than does the fast diode.

BRIEF DESCRIPTION OF THE DRAWINGS

The invention is described in greater detail hereinafter with reference to the attached drawings wherein:
FIGS. 1-3 relate to the prior art.
FIG. 4 is a circuit diagram according to the invention.
FIGS. 5a-5c show the current waveshapes in the circuit of FIG. 4 and
FIGS. 6 and 7 are examples of the interconnection of the fast and slow diodes.

DETAILED DESCRIPTION OF THE PREFERRED EMBODIMENTS

FIG. 4 is identical to FIG. 3, with the exception that the branch constitute by resistor R and capacitor C is replaced by a diode D3, which is slower and has a smaller junction area than diode D1 with which it is parallel. During switching to open the circuit, the fast diode D1 blocks first because it is faster. Diode D3 reaches its blocked state more slowly, with a recovery current IRD3, which is initially a fraction of the recovery current IRD1 of diode D1, because of its smaller junction area and so smaller current handling capacity. This negative recovery current progressively decreases more slowly than that of diode D1 and damps the oscillations of the latter. Thus, when the current in diode D1 tends to become positive again, it is compensated by the current in diode D3, which at that time is still negative. The algebraic addition of the two currents follows a much more damped waveshape than that of the current in diode D1 alone and their sum constitutes the effective current.

FIG. 5a shows the waveshape of the current in diode D1 alone (initial current Id1, recovery current IRD1).

FIG. 5b shows the wavshape of the current in diode D3 alone (initial current Id3, recovery current IRD3).

FIG. 5c represents the net current resulting from the connecting in parallel of the two diodes and demonstrates the significant resulting damping.

For example, it is possible to use a slow diode having a nominal current one tenth the nominal current of fast diode, with the recovery time of the slow diode being typically a few microseconds while that of the fast diode is a few dozen nanoseconds. (The recovery time being the time between the first negative current peak and the first zero crossing following said peak). The total losses are not increased compared with the losses with a fast diode alone.

FIG. 6 shows a simple arrangement for the two diodes. The diodes are constituted by separate semiconductor pellets bonded to the same support, so that they can be fitted in a single package (thus making it possible to limit the cabling inductances). Diode D1 is doped with gold or platinum to speed up the recombination of the carriers present in the semiconductor regions just before blocking. Diode D3 is either not doped or is only slightly doped with gold or platinum to keep the recombination slow.

FIG. 7 illustrates another construction, in which the two diodes are formed in the same semiconductor chip. The central zone of the chip constitutes the fast diode D1 and the peripheral zone the slower diode D3. The central zone surface area is larger than that of the peripheral zone, so that most of the current passes through diode D1. The thickness of the lightly doped N-layer is greater at the periphery than in the center, so that the lifetime of the carriers is longer in the zone corresponding to diode D3. For producing the combined diode D1 plus D3, it is sufficient to provide that the doping of the ohmic contract region (type N) of the cathode of the diode be diffused in two stages, of which one consists of a deep local diffusion selectively in the central zone, with a diffusion mask protecting the peripheral zone, and the other stage being a non-selective diffusion of the same impurity or an impurity of the same type.

It is pssible to envisage other embodiments of diode D3 in integrated or non-integrated form, including an embodiment in which diode D3 is constituted by the base-collector junction of a transistor, whose emitter is directly connected to an anode metalization of the diode, the recovery in said diode-connected transistor being slower than in the main diode.

What is claimed is:

1. In a circuit which includes an inductive load in series with a relatively fast main rectifying diode and a source of alternating voltage designed to switch off and on to switch the diode between a conducting and a blocking state and which tends to oscillate when the diode is switched from the conducting to the blocking state because of parasitic inductances and capacitances in the circuit the improvement for damping the oscillation which comprises a supplementary diode similarly poled in parallel with the main diode and characterized by a recovery time which is substantially longer than that of the main diode and by a current handling capacity smaller than that of the main diode.

2. A switching circuit according to claim 1, wherein the main diode is relative highly doped with recombination centers (gold, platinum, etc.) and the supplementary diode is relatively little doped with recombination centers.

3. A switching circuit according to claim 1, wherein the main diode and the supplementary diode are in a common semiconductor chip, the chip comprising in turn a first surface layer of one conductivity type, an overlying intermediate layer of the opposite conductivity type, and an overlying second surface layer of the opposite conductivity type but higher resistivity material than the intermediate layer, the intermediate layer having a central zone of thickness less than its peripheral zone, and separate ohmic connections to the two surface zones, the central zone defining the main diode and the peripheral zone defining the supplementary diode.

* * * * *